United States Patent [19]

Brannon et al.

[11] Patent Number: 5,894,237
[45] Date of Patent: Apr. 13, 1999

[54] WRITE DRIVER WITH BUFFER CIRCUITS BETWEEN PULL-UP RESISTORS AND UPPER DRIVE TRANSISTORS

[75] Inventors: Craig M. Brannon, Maplewood; John J. Price, Jr., Edina; Jeremy R. Kuehlwein, Woodbury, all of Minn.

[73] Assignee: VTC Inc., Bloomington, Minn.

[21] Appl. No.: 08/903,458

[22] Filed: Jul. 30, 1997

[51] Int. Cl.⁶ .................................................. H03K 3/00
[52] U.S. Cl. .......................... 327/110; 327/423; 327/482; 327/483; 327/489
[58] Field of Search .................................. 327/108, 110, 327/423, 482, 483, 488, 491, 92; 360/66, 68, 46

[56] References Cited

U.S. PATENT DOCUMENTS

| | | | |
|---|---|---|---|
| 4,841,166 | 6/1989 | Harnden | 307/246 |
| 5,296,975 | 3/1994 | Contreras et al. | 360/46 |
| 5,532,631 | 7/1996 | Ngo et al. | 327/110 |
| 5,550,502 | 8/1996 | Aranovsky | 327/423 |
| 5,757,215 | 5/1998 | Schuelke et al. | 327/110 |

Primary Examiner—Timothy P. Callahan
Assistant Examiner—Minh Nguyen
Attorney, Agent, or Firm—Kinney & Lange, P.A.

[57] ABSTRACT

A write driver, having a pair of head pins for connection to a write head, includes two push-pull buffer circuits connected respectively between first and second pull-up resistors and the control nodes of first and second upper drive transistors. The buffer circuits selectively charge and discharge the inherent capacitances of the upper drive transistors, thereby accelerating their turn on and turn off without diminishing head swing. Moreover, connecting the buffer circuits between the pull-up resistors and the upper transistors effectively isolates, or buffers, the pull-up resistors from the self-inductance voltages of the write head, reducing glitching in the write-head output signal.

12 Claims, 2 Drawing Sheets

WRITE DRIVER WITH BUFFER CIRCUITS BETWEEN PULL-UP RESISTORS AND UPPER DRIVE TRANSISTORS

BACKGROUND OF THE INVENTION

The present invention pertains to write drivers which operate the write heads in mass data storage systems, particularly magnetic data storage systems.

In magnetic data storage systems, a magnetic write head writes, or records, data as a sequence of ones and zeros on a moving magnetic medium, such as a magnetic tape or disc. The write head uses an inductive coil to generate magnetic fields which magnetize portions of the medium and thus form patterns representing the ones and zeros on the medium. A "one" is written as a transition in the magnetic pattern on the medium by changing the direction of current through the inductive coil. Thus, writing specific data requires selectively changing the direction of current through the coil of the write head.

Changing the direction of current through the coil is the function of a write driver. A typical write driver includes an H-switch drive circuit and a control circuit. The H-switch drive circuit, which resembles an "H," has two head pins connected to a write head to form the cross-bar of the H, and four drive transistors, which form the upper and lower legs of the H. More specifically, the two drive transistors that form the left upper and lower legs of the H are connected respectively between the left head pin and respective positive and negative supply voltages. And, the two that form the right upper and lower legs of the H are connected respectively between the right head pin and the respective positive and negative supply voltages.

The control circuit, which responds to data signals, selectively operates the four drive transistors as on-off switches, thereby controlling current direction through the write head. Specifically, to direct current left to right through the write head, the control circuit activates (or turns on) the left-upper and the right-lower drive transistors and turns off the right-upper and the left-lower drive transistors. Conversely, to direct current right to left through the write head, the control circuit turns off the left-upper and right-lower drive transistors and turns on the right-upper and the left-lower drive transistors.

Write drivers typically suffer from two problems: the first concerns limitations to switching rate, and the second concerns glitching. Switching rate, a measure of how fast the write driver reverses current direction, defines the spatial transitions written on a magnetic medium, with higher switching rates requiring sharper, more distinctive transitions than lower switching rates. Ultimately, a higher switching rate yields closer data spacing and thus greater data capacity for a magnetic medium.

One factor limiting switching rate is the inherent switching limitation of the drive transistors comprising the H-switch drive circuit. The drive transistors have inherent structural, or parasitic, capacitances which require charging or discharging during switching and thus prevent the drive transistors from instantaneously switching on or off. This charging and discharging limits the switching rate of the write driver.

The second problem, glitching, occurs during reversals of write current direction. Specifically, during reversals of write current direction, the write head exhibits self-inductance, a phenomenon which produces a voltage spike at one of the head pins (depending on the desired current direction). The voltage spike not only shoots several volts above the positive supply voltage of the write driver, but also incites a ringing, or oscillating, voltage that last several nanoseconds before eventually decaying to a negligible level.

The voltage spike and related ringing are troublesome because they feedback through the capacitances of the upper left and right drive transistors to the portion of the control circuit that sets the voltages at the control nodes of these transistors. This feedback causes spurious increases or decreases in the voltages at these nodes, not only disrupting operation of the upper drive transistors, but ultimately producing glitches, or irregularities, in the magnetic patterns written by the write head.

The prior art has addressed the switching-rate limitation and glitching problems with limited success. For example, U.S. Pat. No. 5,296,975 to Contreras discloses a write driver having two MOSFET (metal-oxide-semiconductor field effect transistor) inverters to charge and discharge the capacitances of the upper drive transistors. Contreras also discloses a damping resistor coupled in parallel with its write head to hasten the decay of the ringing voltage. But, Contreras' write drive still suffers from at least four drawbacks.

First, the two MOSFET inverters are large devices and thus occupy significant area of an integrated-circuit implementation. Second, the damping resistor increases power usage without appreciably reducing glitching. Third, Contreras uses a dual current-mirror control circuit which is not only complex but also costly in terms of integrated-circuit area. Fourth, Contreras' write driver uses both bipolar junction transistors and MOSFETs which makes it more complicated to manufacture than a pure bipolar or MOS design.

Thus, there is a need for a simple, more-easily manufactured write driver having circuitry for not only increasing switching rate of the drive transistors, but also isolating the control circuit from the write head to reduce glitching.

SUMMARY OF THE INVENTION

Accordingly, the write driver of the present invention includes two push-pull buffer circuits, connected respectively between first and second pull-up resistors and the control nodes of first and second upper drive transistors. The push-pull buffer circuits, which include respective pairs of npn and pnp buffer transistors, selectively charge and discharge the inherent capacitances of the upper drive transistors, thereby accelerating their turn on and turn off. Moreover, connecting the buffer circuits between the pull-up resistors and the upper transistors reduces glitching by effectively isolating the pull-up resistors from any voltage spikes and ringing.

In one form of the invention, the push-pull buffer circuits include bias circuitry for maintaining the buffer transistors in respective conductive states. The bias circuitry further hastens the turn on and turn off of the upper drive transistors by reducing the turn-on time of the buffer transistors.

DETAILED DESCRIPTION OF THE PREFERRED EMBODIMENTS

Figure 1:
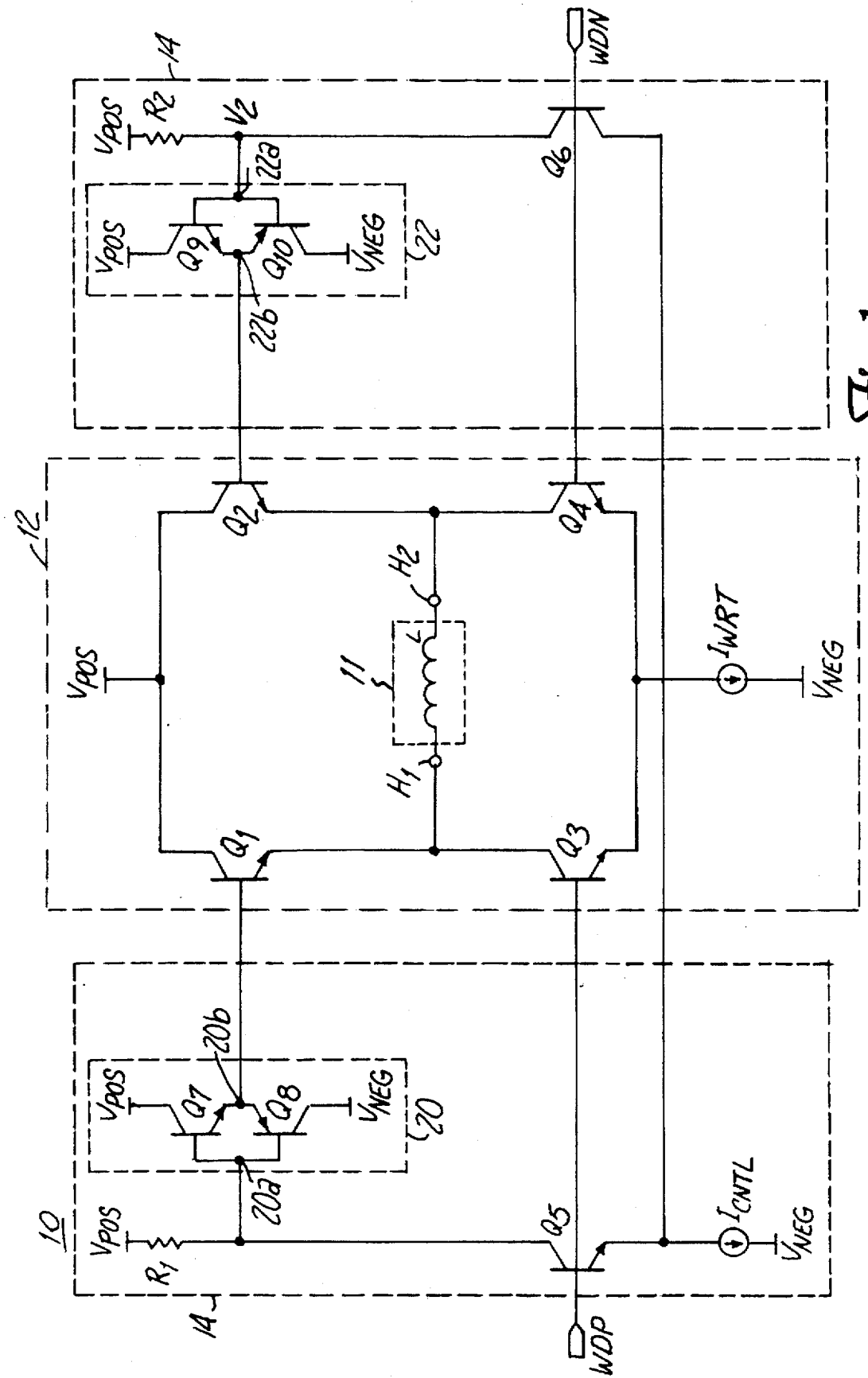
FIG. 1 illustrates a write driver incorporating the teachings of the present invention.

FIG. 1, which illustrates the teachings of the present invention, shows a write driver 10 for switching the direction of current through a magnetic write head, such as write head 11. Write head 11, which is shown coupled between head pins H1 and H2, includes an inductive coil L. Write driver 10 includes two major parts, an H-switch drive circuit 12 and a differential control circuit 14.

H-switch drive circuit 12, connected between positive and negative voltage supply pins (or nodes) Vpos and Vneg, includes matched drive transistors Q1–Q4 and write current generator Iwrt. Supply pin Vpos has a preferred (high) voltage Vpos of 8 volts, and supply pin Vneg has a preferred (low) voltage Vneg of 0 volts. Drive transistors Q1–Q4 are preferably npn-type bipolar junction transistors, each with three terminating regions, or nodes: a control node, called a base, and two controlled nodes, called a collector and an emitter. Transistors Q1–Q4 are preferably capable of conducting 65 milliamperes of current, the preferred current output of write current generator Iwrt.

More particularly, FIG. 1 shows the emitter and collector of upper H-switch drive transistors Q1 and Q2 connected respectively between head pins H1 and H2 and positive voltage supply pin Vpos. The collector and emitter of lower H-switch drive transistors Q3 and Q4 are connected respectively between head pins H1 and H2 and a positive node of write current generator Iwrt. The negative node of current generator Iwrt is connected to negative voltage supply pin Vneg. The bases, or control nodes, of drive transistors Q1–Q4 are connected to differential control circuit 14.

Differential control circuit 14 comprises not only inputs WDP and WDN, matched npn control transistors Q5 and Q6, matched 880-Ohm pull-up resistors R1 and R2, and control current generator Icntl, but also two push-pull buffer circuits 20 and 22. Inputs WDP and WDN are connected respectively to the bases of control transistors Q5 and Q6 and to the bases of lower H-switch drive transistors Q3 and Q4.

Transistors Q5 and Q6, which form an emitter-coupled differential pair, have their emitters connected together and their collectors connected respectively to positive supply pin Vpos via pull-up resistors R1 and R2. The junctions between resistors R1 and R2 and the collectors of transistors Q3 and Q4 form respective control voltage nodes V1 and V2. Control current generator Icntl, which preferably provides a constant control current Icntl of about 8 milliamperes, is connected between negative supply pin Vneg and the junction of the Q5 and Q6 emitters (that is, the emitters of transistors Q5 and Q6).

Buffer circuits 20 and 22 have respective input nodes 20a and 22a coupled to control voltage nodes V1 and V2 and respective output nodes 20b and 22b coupled to the bases (or control nodes) of upper H-switch transistors Q1 and Q2. Buffer circuits 20 and 22 include respective pairs of npn and pnp buffer transistors Q7–Q8 and Q9–Q10, which preferably have emitter areas one-twentieth the emitter areas of the drive transistors. The Q7 and Q8 bases are connected together to define input node 20a, and their emitters are connected together to define output node 20b. Likewise, in buffer circuit 22, the Q9 and Q10 bases define input node 22a, and the Q9 and Q10 emitters define output node 22b. The Q7 and Q9 collectors are connected to positive supply pin Vpos, and the Q8 and Q10 collectors are connected to negative supply pin Vneg.

In operation, control circuit 14 directs control current Icntl through either resistor R1 or resistor R2 in response to complementary signals at inputs WDP and WDN. When input WDP has a higher voltage than input WDN, control current Icntl flows through resistor R1. This activates, or turns on, drive transistors Q2 and Q3, and drives write current Iwrt from positive supply pin Vpos, through write head 11 from pin H2 to pin H1, and into negative supply pin Vneg. Conversely, when input WDN has a higher voltage than input WDP, control current Icntl flows through resistor R2, activating drive transistors Q1 and Q4 and driving write current Iwrt from positive supply pin Vpos, through write head 11 from pin H1 to pin H2, and into negative supply pin Vneg. Thus, the relative voltage of the signals at inputs WDP and WDN controls the direction write current Iwrt flows through the write head, enabling the writing of a specific bit pattern on a magnetic medium.

More specifically, when input WDP has a higher voltage than input WDN (by about 100 millivolts), control circuit 14 turns on drive transistor Q3 and turns off drive transistor Q4. In addition, it turns on control transistor Q5 and turns off control transistor Q6, directing control current Icntl through resistor R1 and away from resistor R2. This condition sets the voltage at control voltage node V1 and input node 20a to Vpos—IcntlR1, that is, the positive supply voltage Vpos minus the voltage across resistor R1 due to control current Icntl. It also sets the voltage at control voltage node V2 and input node 22a approximately to voltage Vpos.

In buffer circuit 20, an input node voltage less than the voltage of node 20b (voltage Vpos) activates transistor Q8 and deactivates transistor Q7. The emitter of transistor Q8 then pulls, or draws, its emitter current from the base of upper H-switch drive transistor Q1, rapidly discharging its capacitance and thus accelerating its turn off. In buffer circuit 22, an input node voltage higher than the voltage at node 22b (equal to voltage Vpos) activates transistor Q9 and deactivates transistor Q10. As a result, transistor Q9 drives, or pushes, its substantial emitter current into the Q2 base, rapidly charging the capacitance of drive transistor Q2 and thus accelerating its turn on. With lower drive transistor Q3 and upper transistor drive Q2 both turned on, write current Iwrt flows through write head 11 from pin H2 to pin H1, causing the head to generate a magnetic field to generate a first magnetic field.

Conversely, when input WDN has a higher voltage than input WDP, control circuit 14 activates drive transistor Q4 and deactivates drive transistor Q3. The higher voltage at input WDN also activates control transistor Q6 and deactivates control transistor Q5, directing control current Icntl through resistor R2 instead of resistor R1. This condition raises the voltage at input node 20a from Vpos—IcntlR1 approximately to Vpos and lowers the voltage at input node 22a from Vpos to Vpos—IcntlR2, the positive supply voltage minus the voltage across resistor R2 due to control current Icntl.

The voltage Vpos at input node 20a activates transistor Q7, causing it to drive its emitter current into the base of drive transistor Q1. The Q7 emitter current (emitter current of transistor Q7) rapidly charges the capacitance of drive transistor Q1 and thus accelerates its activation. In contrast, the voltage Vpos—IcntlR2 at input node 22a turns on transistor Q10 and causes it to rapidly discharge the capacitance of drive transistor Q2 and thus accelerates its turn off. Since drive transistors Q1 and Q4 are both activated, the drive circuit forces write current Iwrt through write head 11 from pin H1 to pin H2, causing the head to generate a second magnetic field opposite the first.

Figure 2:
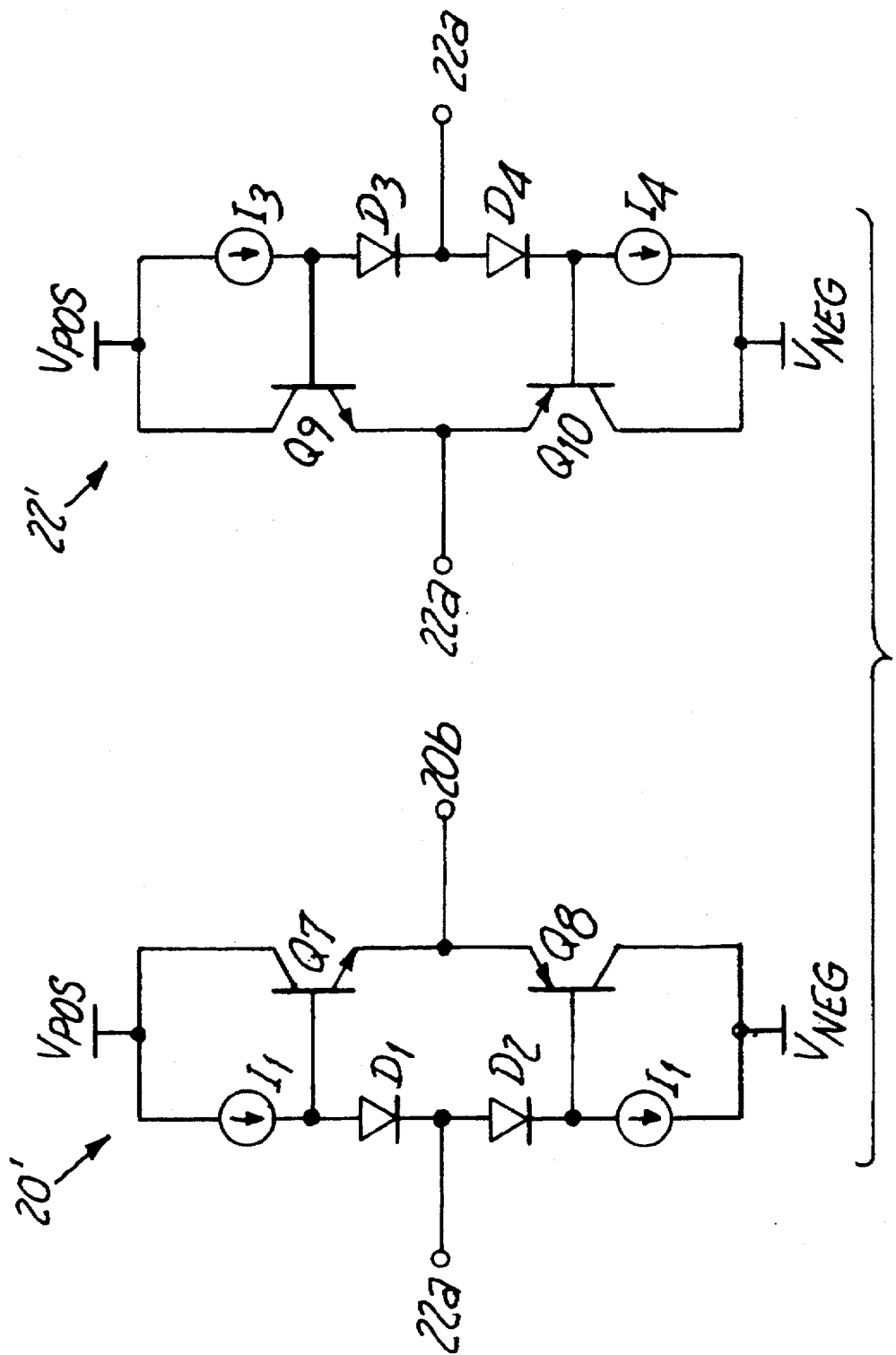
FIG. 2 shows an alternative embodiment of one portion of the present invention.

FIG. 2 shows an alternative embodiment of buffer circuits 20 and 22 respectively labeled 20' and 22'. The alternative embodiment includes bias circuitry that maintains both transistors of each buffer circuit in at least a low-level conductive, that is, active, state throughout operation of the write driver.

The bias circuitry for buffer circuit 20' includes diodes D1 and D2 connected in series between the Q7 and Q8 bases, and current generators I1 and I2, with generator I1 coupled between diode D1 and supply pin Vpos and generator I2 coupled between diode D2 and supply pin Vneg. Similarly, the bias circuit for buffer circuit 22' includes diodes D3 and D4 connected in series between the Q9 and Q10 bases, current generator U coupled between diode D3 and positive supply pin Vpos, and current generator I4 coupled between diode D4 and negative supply pin Vneg. The junction between diodes D1 and D2 and the junction between diodes D3 and D4 form respective input nodes 20a and 22a.

In both buffer circuits 20' and 22', the bias circuitry maintains partial charges on the inherent capacitances of control transistors Q7–Q10, thereby reducing the extent of charging the control transistors need before they turn on and begin fully charging or discharging the capacitances of upper drive transistors Q1 and Q2. Thus, this bias circuitry enhances the buffer circuits and further improves the switching rate of the upper drive transistors Q1 and Q2.

In sum, the present invention teaches a write driver having a relatively-simple differential control circuit that overcomes the switching limitations of typical write drivers by coupling buffer circuits 20 and 22 (or 20' and 22') respectively between pull-up resistors R1 and R2 and the bases of upper H-switch drive transistors Q1 and Q2. The push-pull buffer circuits operate in tandem to alternately charge and discharge the capacitances of the upper drive transistors, thereby accelerating their turn on and turn off and improving the overall switching performance of the write driver.

Moreover, the push-pull buffer circuits effectively isolate, or buffer, the control voltage nodes of the differential control circuit from the voltage spikes and ringing that result from starting, stopping, and reversing the direction of write current in the write head. This, in turn, reduces glitching in the write-head output signal.

Additionally, those skilled in the art will recognize that the output nodes of the push-pull buffers present low impedances to the control nodes of the upper drive transistors. The low impedances are stable in the face of both negative and positive voltage spikes.

Although the present invention has been described with reference to preferred embodiments, workers skilled in the art will recognize that changes may be made in form and detail without departing from the spirit and scope of the invention.

What is claimed is:

1. In a write driver that includes first and second head nodes for connection to a write head, an H-drive circuit having first and second upper drive transistors and first and second lower drive transistors, the first upper and lower drive transistors being coupled to a first head node and the second upper and lower drive transistors being coupled to a second head node, first and second inputs for receiving differential data signals, a differential control circuit having a first control transistor having a control node connected to the first input and having a controlled node and a second control transistor having a control node connected to the second input and having a controlled node, and first and second pull-up resistors coupled between a supply node and respective controlled nodes of the first and second control transistors, the improvement comprising:

a first push-pull buffer circuit having a first push transistor and a first pull transistor, the first push and pull transistors having respective bases coupled together to form a first input node, and having respective emitters coupled together to form a first output node, the first input node being coupled to the controlled node of the first control transistor and the first output node being coupled to a control node of the first upper drive transistor, the first pull transistor operating to pull current from the control node of the first upper drive transistor when the first input operates the first lower drive transistor to conduction and the first push transistor operating to push current into the control node of the first upper drive transistor when the second input operates the second lower drive transistor to conduction; and a second push-pull buffer circuit having a second push transistor and a second pull transistor, the second push and pull transistors having respective bases coupled together to form a second input node, and having respective emitters coupled together to form a second output node, the second input node being coupled to the controlled node of the second control transistor and the second output node being coupled to a control node of the second upper drive transistor, the second pull transistor operating to pull current from the control node of the second upper drive transistor when the second input operates the first lower drive transistor to conduction and the second push transistor operating to push current into the control node of the second upper drive transistor when the first input operates the second lower drive transistor to conduction.

2. The write driver of claim 1 wherein each of the first and second push-pull buffer circuits further includes a bias subcircuit coupled to the bases of the respective push and pull transistors for maintaining the respective push and pull transistors in respective conductive states.

3. The write drive of claim 1 wherein the first and second upper drive transistors and the first and second control transistors are bipolar junction transistors.

4. A write driver having first and second head nodes for coupling to a write head, first and second data inputs for receiving write data signals, and positive and negative supply nodes, the write driver comprising:

an H-drive circuit including first and second upper drive transistors coupled respectively between the positive supply node and the first and second head nodes and first and second lower drive transistors coupled respectively between the negative supply node and the first and second head nodes, the first and second upper drive transistors having respective control nodes;

a differential control circuit coupled to the H-drive circuit and to the first and second data inputs for controlling the first and second upper and lower drive transistors, the control circuit having first and second control transistors each having a control node connected to a respective first or second data input;

first and second resistors coupled between the positive supply node and a controlled node of a respective one of the first and second control transistors; and first and second buffer circuits each including push and pull transistors having respective bases coupled together to form an input node and having respective emitters coupled together to form an output node, the input node being coupled to a junction between the respective first or second resistor and the controlled node of the respective first or second control transistor and the output node being coupled to the control node of the respective first or second upper drive transistor, the pull transistor of the respective buffer circuit operating to pull current from the control node of the respective upper drive transistor to drive the respective upper drive transistor to a non-conduction state when the respective one of the first and second data inputs operates the respective lower drive transistor to conduction, and the push transistor of the respective buffer circuit operating to push current into the control node of the respective upper drive transistor when the other of the first and second data inputs operates the other lower drive transistor to conduction.

5. The write driver of claim 4 wherein each of the first and second buffer circuits further includes a bias subcircuit coupled to the bases of the respective push and pull transistors for maintaining the respective push and pull transistors in respective conductive states.

6. The write driver of claim 4 wherein the first and second upper drive transistors and the first and second control transistors are bipolar junction transistors.

7. The write driver of claim 2 wherein each bias subcircuit includes a first current source for inserting current to the respective push transistor and a second current source for sinking current from the respective pull transistor.

8. The write driver of claim 5 wherein each bias subcircuit includes a first current source for inserting current to the respective push transistor and a second current source for sinking current from the respective pull transistor.

9. A write driver having first and second head nodes for coupling to a write head, first and second data inputs for receiving write data signals, and positive and negative supply nodes, the write driver comprising:

a drive circuit including circuit for driving a write head responsive to the first and second data inputs first and second drive transistors coupled respectively between the positive supply node and the first and second head nodes, the first and second drive transistors having respective control nodes;

a differential control circuit coupled to the drive circuit and to the first and second data inputs for controlling the first and second drive transistors, the control circuit having first and second control transistors each having a control node connected to a respective first or second data input;

first and second resistors coupled between the positive supply node and a controlled node of a respective first or second control transistor;

a first buffer circuit including a first push transistor and a first pull transistor each having respective bases coupled together to form a first input node and having respective emitters coupled together to form a first output node, the first input node being coupled to a junction between the first resistor and the controlled node of the first control transistor and the first output node being coupled to the control node of the first drive transistor, the first pull transistor operating to pull current from the control node of the first drive transistor to drive the first drive transistor to a non-conduction state when the first control transistor operates to conduction, and the first push transistor operating to push current into the control node of the first drive transistor when the second control transistor operates to conduction; and a second buffer circuit including a second push transistor and a second pull transistor each having respective bases coupled together to form a second input node and having respective emitters coupled together to form a second output node, the second input node being coupled to a junction between the second resistor and the controlled node of the second control transistor and the second output node being coupled to the control node of the second drive transistor, the second pull transistor operating to pull current from the control node of the second drive transistor to drive the second drive transistor to a non-conduction state when the second control transistor operates to conduction, and the second push transistor operating to push current into the control node of the second drive transistor when the first control transistor operates to conduction.

10. The write driver of claim 9 wherein the first and second drive transistors and the first and second control transistors are bipolar junction transistors.

11. The write driver of claim 9 wherein each of the first and second buffer circuits further includes a bias subcircuit coupled to the bases of the respective push and pull transistors for maintaining the respective push and pull transistors in respective conductive states.

12. The write driver of claim 11 wherein each bias subcircuit includes a first current source for inserting current to the respective push transistor and a second current source for sinking current from the respective pull transistor.

* * * * *